United States Patent [19]

Taki et al.

[11] 4,239,576

[45] Dec. 16, 1980

[54] PROCESS FOR MOUNTING ELECTRONIC PARTS

[75] Inventors: Yasuo Taki, Hirakata; Yoshihiko Misawa, Katano; Shigeru Araki, Katano; Kazuhiro Mori, Katano; Souhei Tanaka, Hirakata, all of Japan

[73] Assignee: Matsushita Electric Industrial Co., Ltd., Osaka, Japan

[21] Appl. No.: 58,319

[22] Filed: Jul. 17, 1979

[30] Foreign Application Priority Data

Jul. 19, 1978 [JP] Japan .................................. 53-88833
Jan. 18, 1979 [JP] Japan .................................. 54-4530

[51] Int. Cl.³ .......................................... B32B 31/26
[52] U.S. Cl. ................................. 156/297; 156/299; 156/300; 156/302; 156/303
[58] Field of Search ............... 156/297, 299, 300, 302, 156/303; 29/25.35, 576 J, 576 S, 577 R, 589, 626, DIG. 1; 361/400, 402, 412, 418, 420

[56] References Cited

U.S. PATENT DOCUMENTS

| 3,600,246 | 8/1971 | Breen | 156/299 |
| 3,666,588 | 5/1972 | Wanesky | 156/299 |
| 3,965,277 | 6/1976 | Guditz | 156/300 |

*Primary Examiner*—Marion McCamish
*Attorney, Agent, or Firm*—Spencer & Kaye

[57] ABSTRACT

A process for mounting electronic parts of very small size on electronic circuit boards or substrates, in which the substrates are maintained in predetermined relative positions, and a dispenser unit dispensing a bonding material for bonding the electronic parts to each of the substrates, a mounting unit mounting the electronic parts on each of the substrates, and/or an inspecting unit inspecting the position and/or the electrical properties of the electronic parts mounted on each of the substrates are disposed in the same relative positions as those of the substrates to carry out their individual functions on the associated substrates, so that the electronic parts can be efficiently and rationally mounted on the substrates.

5 Claims, 15 Drawing Figures

PROCESS FOR MOUNTING ELECTRONIC PARTS

This invention relates to a process for mounting electronic parts of very small size on an electronic circuit board or substrate.

Leadless type electronic parts of very small size represented by, for example, chip type resistors and chip type laminated ceramic capacitors (which electronic parts will be referred to hereinafter as chip parts) have heretofore been mounted on an electronic circuit board (which will be referred to hereinafter merely as a substrate) by one of two processes. The first process comprises coating previously a bonding material or a creamy solder on a substrate by, for example, a screen printing method or a dispenser method, temporarily fixing various chip parts at predetermined positions on the substrate, and after inspecting the position of the chip parts on the substrate and also inspecting the electrical properties of the chip parts as required, soldering the electrodes of the chip parts to the predetermined portions of the electronic circuit on the substrate. The second process comprises applying previously a solder layer to predetermined positions on a substrate at which various chip parts are to be connected to an electronic circuit, coating a flux on the circuit bearing surface of the substrate, temporarily fixing the chip parts at the predetermined positions on the substrate, heating the solder layer on the substrate to solder the electrodes of the chip parts to the predetermined portions of the electronic circuit, and then inspecting the position and the electrical properties of the chip parts on the substrate. However, the former process requires the step of previously coating the bonding material or creamy solder at the predetermined positions on the substrate by an external coating unit such as an external screen printing unit, prior to the step of mounting the chip parts on the substrate. Further, due to the fact that the step of coating the bonding material or creamy solder on the substrate by the external coating unit is carried out separately from the step of mounting the chip parts on the substrate, the former process involves such a problem, among others, that careful attention must be paid to the handling of the sticky substrate between these two steps. Further, due to the fact that the step of inspection by an external inspecting unit is carried out separately from the step of mounting the chip parts on the substrate, dislocation of the chip parts from their predetermined positions tends to occur during the inspecting step unless careful attention must be paid to the handling of the substrate.

The latter process is advantageous over the former process in that a coating unit of relatively simple construction can be used to coat the flux on the circuit bearing surface of the substrate. However, the latter process requires also an external unit for carrying out the step of flux coating, and extremely careful attention must also be paid to the handling of the sticky substrate when the flux is coated on the entire surface of the substrate. Further, during the step of heating to solder the electrodes of the chip parts to the predetermined portions of the electronic circuit, fumes and bad odors tend to emit as a result of vaporization of the flux, and the loss of the adhesive force will cause dislocation of the chip parts from the predetermined positions at which they have been temporarily fixed on the substrate. The latter process includes also such a problem that an external inspecting unit is required as pointed out in regard to the former process.

It is therefore a primary object of the present invention to provide a novel and improved process which obviates the aforementioned defects of the prior art processes and which ensures rational and convenient mounting of the chip parts on the substrate.

The chip part mounting process according to the present invention provides the following advantages, among others:

(1) Any especial external unit such as the external screen printing unit is unnecessary in the step preceding the step of chip part mounting.

(2) Preparation of the substrates and other steps are facilitated because the substrates coated with the bonding material can be handled within the mounting apparatus without being carried to the exterior of the apparatus.

(3) The bonding material coating step and the chip part mounting step can both be carried out within the single apparatus.

(4) The step of inspecting the position of the chip parts mounted on the substrate and/or the step of inspecting the electrical properties of the chip parts can be carried out within the mounting apparatus without requiring any especial external units.

These and other objects, features and advantages of the present invention will be apparent from the following detailed description taken in conjunction with the accompanying drawings, in which.

The present invention will now be described in detail with reference to the drawings.

Figure 1:
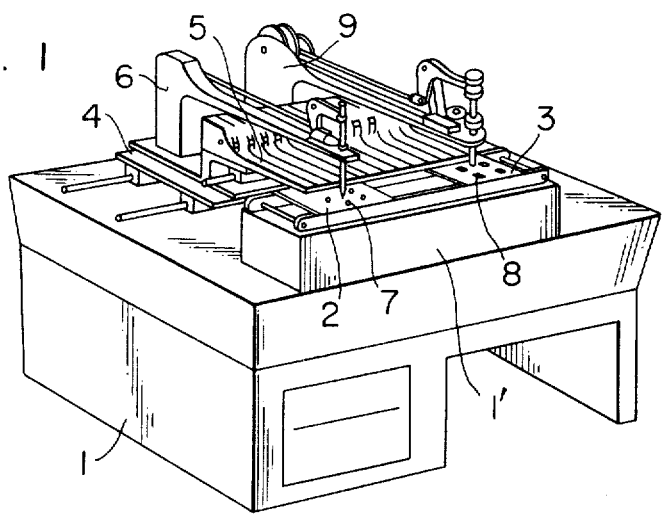
FIG. 1 is a perspective general view of a chip part mounting apparatus preferably used for the practice of a first embodiment of the process according to the present invention.

FIG. 1 shows a chip part mounting apparatus preferably used for the practice of a first embodiment of the process according to the present invention. Referring to FIG. 1, the mounting apparatus comprises a body 1 supporting thereon a chip part transfer unit 1' which can transfer a pair of substrates 2 and 3 and hold these substrates 2 and 3 in predetermined relative positions. Independently of the transfer unit 1', there is also provided an XY table 4 on the body 1. This XY table 4 supports fixedly thereon a chip part feeding unit 5, a bonding material dispenser unit 6 adapted for dispensing intermittently a very small constant amount of a bonding material onto the substrate 2 to coat the bonding material at predetermined points on the substrate 2, and a chip part mounting unit 9 adapted for mounting a plurality of chip parts 8 fed from the chip part feeding unit 5 at predetermined positions on the substrate 3. The XY table 4 is movable in both the X direction and the Y direction in a horizontal plane to bring the units 5, 6 and 9 in any desired predetermined positions. The relative positions of the dispenser unit 6 and mounting unit 9 on this XY table 4 are selected to correspond to the relative positions of the substrates 2 and 3 positioned on the transfer unit 1', so that the points 7 on the substrate 2 to which the bonding material is dispensed from the dispenser unit 6 coincide always with the chip part mounting positions on the substrate 3 at which the chip parts 8 are mounted by the mounting unit 9.

Figure 2:
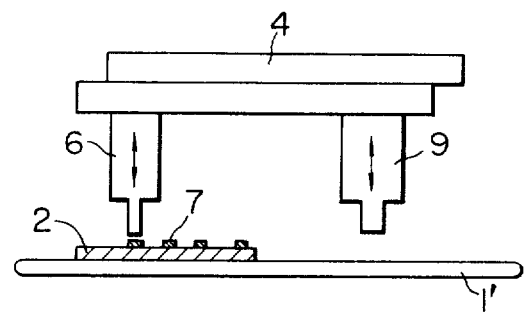
FIGS. 2 and 3 are schematic sectional views illustrating the principle of the process carried out by the apparatus shown in FIG. 1.
Figure 3:
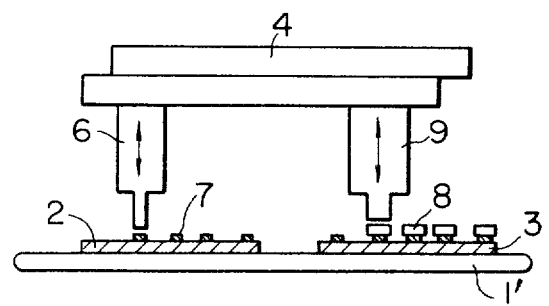

The principle of the first embodiment of the process according to the present invention will be described with reference to FIGS. 2 and 3. Referring to FIG. 2, the dispenser unit 6 and the mounting unit 9 are always maintained in the illustrated relative positions on the XY table 4, and a first substrate 2 is fixedly positioned on the transfer unit 1' in one of the predetermined positions beneath the dispenser unit 6. In that state, the XY table 4 is moved intermittently according to a predetermined program so that, each time the XY table 4 is moved from one position to the next, the bonding material 7 of the constant amount dispensed from the dispenser unit 6 is coated at one of the predetermined points on the substrate 2. Upon completion of coating of the bonding material 7 at all of the predetermined points on the substrate 2, this substrate 2 is transferred to the other predetermined position on the transfer unit 1 to be fixedly positioned beneath the mounting unit 9 as shown in FIG. 3. Thus, the substrate 2 coated with the bonding material 7 provides a substrate 3 as seen in FIG. 3.

Referring to FIG. 3, a new or second substrate 2 is fixedly positioned on the transfer unit 1' in the predetermined position beneath the dispenser unit 6, and the XY table 4 is moved intermittently according to the predetermined program again so that the bonding material 7 of the constant amount dispensed from the dispenser unit 6 is coated at the predetermined points on the substrate 2 with the programmed movement of the XY table 4. At the same time, chip parts 8 fed from the chip part feeding unit 5 are mounted by the mounting unit 9 on the substrate 3 having the bonding material 7 coated at the predetermined points. The above operation is repeated so that coating of the bonding material 7 on the substrate 2 and mounting of the chip parts 8 on the substrate 3 can be efficiently carried out simultaneously by the programmed movement of the single XY table 4. After the chip parts 8 have been mounted on the substrate 3, an external unit such as a conventional solder dipper unit is used to solder the electrodes of the chip parts 8 to the predetermined portions of the electronic circuit on the substrate 3 to obtain the product.

Figure 4:
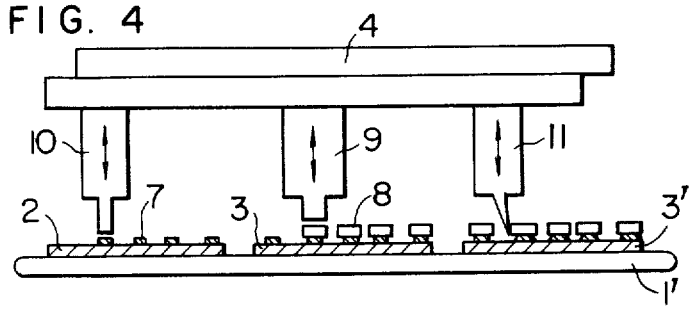
FIG. 4 is a schematic sectional view illustrating the principle of a second embodiment of the process according to the present invention.

A second embodiment of the present invention will be described with reference to FIG. 4. Referring to FIG. 4, three substrates 2, 3 and 3' are fixedly positioned in their predetermined relative positions on a transfer unit 1', and an XY table 4 supporting a creamy solder coating unit 10, a chip part mounting unit 9 and a thermal fixing unit 11 associated with the respective substrates 2, 3 and 3' is moved intermittently according to a predetermined program as in the first embodiment. Thus, coating of the creamy solder at the predetermined points on the substrate 2, mounting of the chip parts 8 at the predetermined positions on the substrate 3 and local heating of the substrate 3' for fixing the chip parts 8 by the fused solder can be simultaneously carried out with the programmed movement of the single XY table 4.

This process is most rational in that all the steps required for completing the product can be efficiently carried out within the single apparatus.

Figure 5:
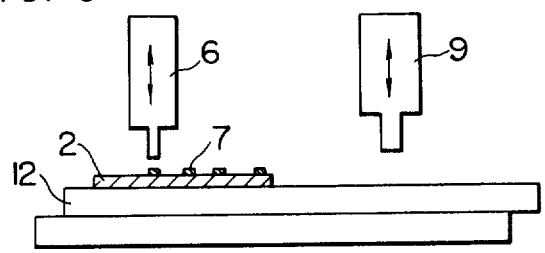
FIGS. 5 and 6 are schematic sectional views illustrating the principle of a third embodiment of the process according to the present invention.
Figure 6:
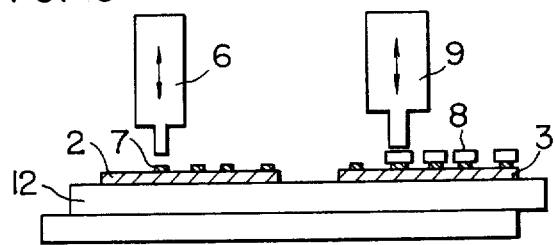

A third embodiment of the present invention will be described with reference to FIGS. 5 and 6. Referring to FIG. 5, a bonding material dispenser unit 6 and a chip part mounting unit 9 are always maintained in the illustrated relative positions, and a first substrate 2 is fixedly positioned on an XY table 12 in one of the predetermined positions beneath the dispenser unit 6. This XY table 12 is movable in both the X direction and the Y direction in a horizontal plane. In that state, the XY table 12 is moved intermittently according to a predetermined program so that, each time the XY table 12 is moved from one position to the next, a bonding material 7 of a constant amount dispensed from the dispenser unit 6 is coated at one of predetermined points on the substrate 2. Upon completion of coating of the bonding material 7 at all of the predetermined points on the substrate 2, this substrate 2 is transferred to the other predetermined position on the XY table 12 to be fixedly positioned beneath the mounting unit 9 as shown in FIG. 6. Thus, the substrate 2 coated with the bonding material 7 provides a substrate 3 as seen in FIG. 6.

Referring to FIG. 6, a new or second substrate 2 is fixedly positioned on the XY table 12 in the predetermined position beneath the dispenser unit 6, and the XY table 12 is moved intermittently according to the predetermined program again so that the bonding material 7 of the constant amount dispensed from the dispenser unit 6 is coated at the predetermined points on the substrate 2 with the programmed movement of the XY table 12. At the same time, chip parts 8 are mounted by the mounting unit 9 on the substrate 3 having the bonding material 7 coated at the predetermined points. The above operation is repeated so that coating of the bonding material 7 at the predetermined points on the substrate 2 and mounting of the chip parts 8 at the predetermined positions on the substrate 3 can be efficiently carried out simultaneously by the programmed movement of the single XY table 12. After the chip parts 8 have been mounted on the substrate 3, an external unit such as a conventional solder dipper unit is used to solder the electrodes of the chip parts 8 to the predetermined portions of the electronic circuit on the substrate 3 to obtain the product.

Figure 7:
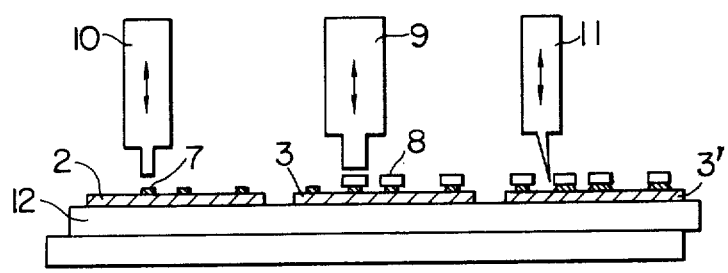
FIG. 7 is a schematic sectional view illustrating the principle of a fourth embodiment of the process according to the present invention.

A fourth embodiment of the present invention will be described with reference to FIG. 7. Referring to FIG. 7, three substrates 2, 3 and 3' are fixedly positioned in their predetermined relative positions on an XY table 12, and a creamy solder coating unit 10, a chip part mounting unit 9 and a thermal fixing unit 11 are disposed above the substrates 2, 3 and 3' respectively. The XY table 12 is moved intermittently according to a predetermined program as in the second embodiment, so that coating of the creamy solder at the predetermined points on the substrate 2, mounting of the chip parts 8 at the predetermined positions on the substrate 3 and local heating of the substrate 3' for fixing the chip parts 8 by the fused solder can be simultaneously carried out with the programmed movement of the single XY table 12.

This process is quite rational in that all the steps required for completing the product can be efficiently carried out within the single apparatus.

Figure 8:
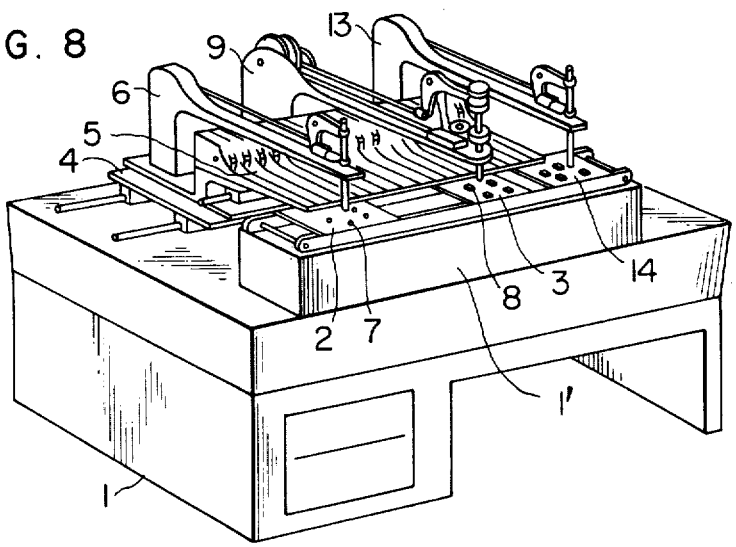
FIG. 8 is a perspective general view of another chip part mounting apparatus preferably used for the practice of a fifth embodiment of the process according to the present invention.

FIG. 8 shows another chip part mounting apparatus preferably used for the practice of a fifth embodiment of the process according to the present invention. Referring to FIG. 8, the apparatus comprises a body 1 supporting thereon a transfer unit 1' which can transfer three substrates 2, 3 and 14 and hold these substrates 2, 3 and 14 in their predetermined relative positions. Independently of the transfer unit 1', there is also provided an XY table 4 on the body 1. This XY table 4 supports fixedly thereon a chip part feeding unit 5, a bonding material dispenser unit 6 adapted for dispensing intermittently a very small constant amount of a bonding material onto the substrate 2 to coat the bonding material at predetermined points on the substrate 2, a chip part mounting unit 9 adapted for mounting a plurality of chip parts 8 fed from the chip part feeding unit 5 at predetermined positions on the substrate 3, and a chip part inspecting unit 13 adapted for inspecting the position of the chip parts 8 mounted on the substrate 14. The XY table 4 is movable in both the X direction and the Y direction in a horizontal plane to bring the units 5, 6, 9 and 13 in any desired predetermined positions. The relative positions of the dispenser unit 6, mounting unit 9 and inspecting unit 13 on this XY table 4 are selected to correspond to the relative positions of the respective substrates 2, 3 and 14 positioned on the transfer unit 1', so that the points 7 on the substrate 2 to which the bonding material is dispensed from the dispenser unit 6 coincide always with the chip part mounting positions on the substrate 3 at which the chip parts 8 are mounted by the mounting unit 9, and the positions inspected by the inspecting unit 13 coincide with the mounted positions of the chip parts 8 on the substrate 14.

Figure 9:
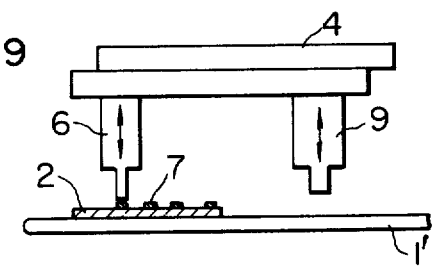
FIGS. 9, 10 and 11 are schematic sectional views illustrating the principle of the process carried out by the apparatus shown in FIG. 8.
Figure 10:
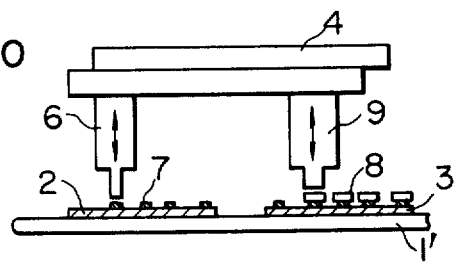

The principle of the fifth embodiment of the process according to the present invention will be described with reference to FIGS. 9 to 11. Referring to FIG. 9, the dispenser unit 6 and the mounting unit 9 are always maintained in the illustrated relative positions on the XY table 4, and a first substrate 2 is fixedly positioned on the transfer unit 1' in one of the predetermined positions beneath the dispenser unit 6. In that state, the XY table 4 is moved intermittently according to a predetermined program so that, each time the XY table 4 is moved from one position to the next, the bonding material 7 of the constant amount dispensed from the dispenser unit 6 is coated at one of the predetermined points on the substrate 2. Upon completion of coating of the bonding material 7 at all of the predetermined points on the substrate 2, this substrate 2 is transferred to the next predetermined position on the transfer unit 1' to be fixedly positioned beneath the mounting unit 9 as shown in FIG. 10. Thus, the substrate 2 coated with the bonding material 7 provides a substrate 3 as seen in FIG. 10.

Referring to FIG. 10, a new or second substrate 2 is fixedly positioned on the transfer unit 1' in the predetermined position beneath the dispenser unit 6, and the XY table 4 is moved intermittently according to the predetermined program again so that the bonding material 7 of the constant amount dispensed from the dispenser unit 6 is coated at the predetermined points on the substrate 2 with the programmed movement of the XY table 4. At the same time, chip parts 8 fed from the chip part feeding unit 5 are mounted by the mounting unit 9 at the predetermined positions on the substrate 3 having the bonding material 7 coated at the predetermined points. After the bonding material 7 has been coated at all of the predetermined points on the substrate 2 and the chip parts 8 have been mounted at all of the predetermined positions on the substrate 3, the substrate 2 is transferred to the next predetermined position on the transfer unit 1' to be fixedly positioned beneath the mounting unit 9, and the substrate 3 is transferred to the final predetermined position on the transfer unit 1' to be fixedly positioned beneath the inspecting unit 13, as shown in FIG. 11. Thus, the substrate 2 coated with the bonding material 7 provides a substrate 3, and the substrate 3 mounted with the chip parts 8 provides a substrate 14 as seen in FIG. 11.

Figure 11:
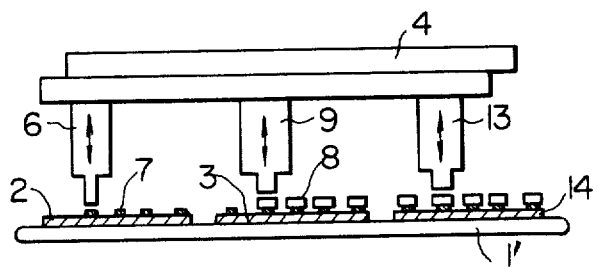

Referring to FIG. 11, a third substrate 2 is fixedly positioned on the transfer unit 1' in the predetermined position beneath the dispenser unit 6, and the XY table 4 is moved intermittently according to the predetermined program again so that the bonding material 7 of the constant amount dispensed from the dispenser unit 6 is coated at the predetermined points on the substrate 2 with the programmed movement of the XY table 4. At the same time, chip parts 8 fed from the chip part feeding unit 5 are mounted by the mounting unit 9 at the predetermined positions on the substrate 3 having the bonding material 7 coated at the predetermined points. Also, at the same time, the inspecting unit 13 inspects the position of the chip parts 8 on the substrate 14 having the chip parts 8 mounted thereon. The above operation is repeated so that coating of the bonding material 7 at the predetermined points on the substrate 2, mounting of the chip parts 8 at the predetermined positions on the substrate 3 and inspection of the position of the chip parts 8 on the substrate 14 can be efficiently carried out simultaneously by the programmed movement of the single XY table 4. After the positions of all the chip parts 8 on the substrate 14 have been inspected by the inspecting unit 13, an external unit such as a conventional solder dipper unit is used to solder the electrodes of the chip parts 8 to the predetermined portions of the electronic circuit on the substrate 14 to obtain the product.

Figure 12:
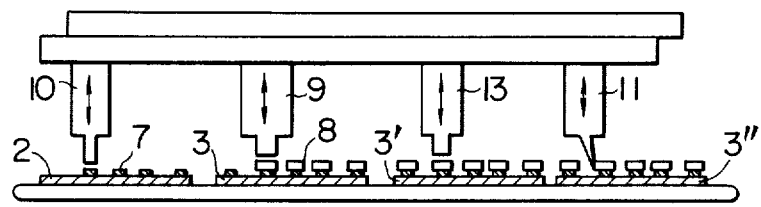
FIGS. 12, 13 and 14 are schematic sectional views illustrating the principles of a sixth embodiment, a seventh embodiment and an eighth embodiment respectively of the process according to the present invention.

A sixth embodiment of the present invention will be described with reference to FIG. 12. Referring to FIG. 12, four substrates 2, 3, 3' and 3" are fixedly positioned in their predetermined relative positions on a transfer unit 1', and an XY table 4 supporting a creamy solder coating unit 10, a chip part mounting unit 9, an inspecting unit 13 and a thermal fixing unit 11 associated with the respective substrates 2, 3, 3' and 3" is moved intermittently according to a predetermined program as in the fifth embodiment. Thus, coating of the creamy solder at the predetermined points on the substrate 2, mounting of the chip parts 8 at the predetermined positions on the substrate 3, inspection of the electrical properties, for example, the resistance values of the chip parts 8 on the substrate 3', and local heating of the substrate 3" for fixing the chip parts 8 by the fused solder can be simultaneously carried out with the programmed movement of the single XY table 4.

This process is most rational in that all the steps required for completing the product can be efficiently carried out within the single apparatus.

Figure 13:
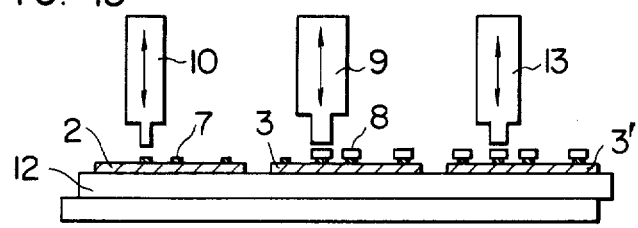

A seventh embodiment of the present invention will be described with reference to FIG. 13. Referring to FIG. 13, three substrates 2, 3 and 3' are fixedly positioned in their predetermined relative positions on an XY table 12, and a creamy solder coating unit 10, a chip part mounting unit 9 and a chip part inspecting unit 13 are disposed above the substrates 2, 3 and 3' respectively. The XY table 12 is moved intermittently according to a predetermined program so that coating of the creamy solder at the predetermined points on the substrate 2, mounting of the chip parts 8 at the predetermined positions on the substrate 3, and inspection of the electrical properties of the chip parts 8 on the substrate 3' can be simultaneously carried out with the programmed movement of the single XY table 12.

Figure 14:
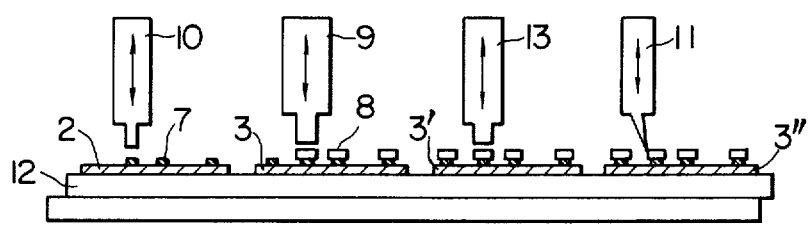

A eighth embodiment of the present invention will be described with reference to FIG. 14. Referring to FIG. 14, four substrates 2, 3, 3' and 3" are fixedly positioned in their predetermined relative positions on an XY table 12, and a creamy solder coating unit 10, a chip part mounting unit 9, a chip part inspecting unit 13 and a thermal fixing unit 11 are disposed above the substrates 2, 3, 3' and 3" respectively. The XY table 12 is moved according to a predetermined program so that coating of the creamy solder at the predetermined points on the substrate 2, mounting of the chip parts 8 at the predetermined positions on the substrate 3, inspection of the chip parts 8 on the substrate 3', and local heating of the substrate 3" for fixing the chip parts 8 by the fused solder can be carried out simultaneously with the programmed movement of the single XY table 12. This process is quite rational in that all the steps required for completing the product can be efficiently carried out within the single apparatus.

Figure 15:
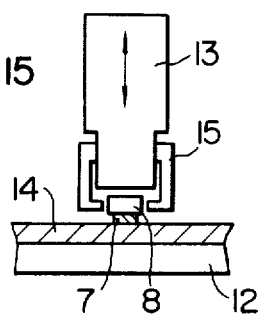
FIG. 15 is a schematic sectional view of one form of the inspecting unit preferably used in the present invention.

One form of the inspecting unit 13 preferably employed in the present invention will be described with reference to FIG. 15. Referring to FIG. 15, the substrate 14 shown in FIG. 11 is fixedly positioned on the XY table 12 which is movable in both the X direction and the Y direction orthogonal with respect to the moving direction of the inspecting unit 13, and the chip parts 8 are bonded to the substrate 14 by the bonding material 7. In that state, the XY table 12 is moved intermittently according to the predetermined program, and the position of each indivudual chip part 8 on the substrate 14 is inspected by a pair of non-contact inspection terminals 15 provided on the inspecting unit 13.

That is, in the form shown in FIG. 15, the non-contact inspection terminals 15 are spaced apart from each other by the distance equal to the allowance of dislocation of each individual chip part 8 from its normal position. Thus, when a chip part 8 is mounted at the normal position, the non-contact inspection terminals 15 do not make contact with such a chip part 8, while when a chip part 8 is dislocated beyond the allowable limit, the non-contact inspection terminals 15 make contact with such a chip part 8 thereby detecting dislocation of the chip part 8 from the normal position.

In another form of the inspecting unit 13 which is used also for the measurement and inspection of the electrical properties of the chip parts 8, a pair of contact fingers capable of making contact with the terminals of each individual chip part 8 are additionally provided to carry out such an additional function in addition to the function of the position inspection.

The foregoing detailed description clarifies the marked advantages of the present invention. The advantages will be summarized again as follows:

(1) Any especial external unit such as the external screen printing unit is unnecessary in the step preceding the step of chip part mounting.

(2) Preparation of the substrates and other steps are facilitated because the substrates coated with the bonding material can be handled within the mounting apparatus without being carried to the exterior of the apparatus.

(3) The system is quite rational in that the bonding material coating step and the chip part mounting step can both be carried out within the single apparatus.

(4) The step of inspecting the position of the chip parts mounted on the substrate and/or the step of inspecting the electrical properties of the chip parts can be carried out within the mounting apparatus without requiring any especial external units.

What is claimed is:

1. A process for mounting electronic parts comprising the steps of:
   preparing a plurality of substrates on each of which a plurality of electronic parts are to be mounted;
   disposing said substrates on first movable means in a relation in which said substrates are maintained in predetermined relative positions;
   disposing dispenser means for dispensing a bonding material for bonding the electronic parts to each of said substrates and mounting means for mounting the electronic parts on each of said substrates, on second movable means in a relation in which said dispenser means and said mounting means are maintained in the same relative positions as those of said substrates on said first movable means;
   moving said second movable means relative to said first movable means according to a predetermined program while actuating said dispenser means and said mounting means, thereby dispensing the bonding material from said dispenser means to predetermined points on the substrate positioned relative to said dispenser means, while, at the same time, mounting the electronic parts by said mounting means at predetermined positions on the substrate positioned relative to said mounting means;
   subsequently transferring said first-mentioned substrate from the position associated with said dispenser means to the position associated with said mounting means by said first movable means; and
   repeating the above steps thereby sequentially carrying out dispensing of the bonding material to the same points on said substrates and mounting of the electronic parts at the same positions on said substrates.

2. A process for mounting electronic parts comprising the steps of:
   preparing at least three substrates on each of which a plurality of electronic parts are to be mounted;
   disposing said three substrates on first movable means in a relation in which said three substrates are maintained in predetermined relative positions;
   disposing dispenser means for dispensing a bonding material for bonding the electronic parts to each of said substrates, mounting means for mounting the electronic parts on each of said substrates and fixing means for fixing the bonding material, on second movable means in a relation in which said dispenser means, said mounting means and said fixing means are maintained in the same relative positions as those of said three substrates on said first movable means;

moving said second movable means relative to said first movable means according to a predetermined program while actuating said dispenser means, said mounting means and said fixing means, thereby dispensing the bonding material from said dispenser means to predetermined points on the substrate positioned relative to said dispenser means, while, at the same time, mounting the electronic parts by said mounting means at predetermined positions on the substrate positioned relative to said mounting means and fixing by said fixing means the bonding material on the substrate positioned relative to said fixing means;

subsequently transferring said first-mentioned substrate from the position associated with said dispenser means to the position associated with said mounting means, while, at the same time, transferring said second-mentioned substrate from the position associated with said mounting means to the position associated with said fixing means by said first movable means; and repeating the above steps thereby sequentially carrying out dispensing of the bonding material to the same points on said substrates, mounting of the electronic parts at the same positions on said substrates and fixing of the bonding material on said substrates.

3. A process for mounting electronic parts comprising the steps of:

preparing a plurality of substrates on each of which a plurality of electronic parts are to be mounted;

disposing said substrates on first movable means in a relation in which said substrates are maintained in predetermined relative positions;

disposing dispenser means for dispensing a bonding material for bonding the electronic parts to each of said substrates, mounting means for mounting the electronic parts on each of said substrates and inspecting means for inspecting the position and/or the electrical properties of the electronic parts mounted on each of said substrates, on second movable means in a relation in which said dispenser means, said mounting means and said inspecting means are maintained in the same relative positions as those of said substrates on said first movable means;

moving said second movable means relative to said first movable means according to a predetermined program while actuating said dispenser means, said mounting means and said inspecting means, thereby dispensing the bonding material from said dispenser means to predetermined points on the substrate positioned relative to said dispenser means, while, at the same time, mounting the electronic parts by said mounting means at predetermined positions on the substrate positioned relative to said mounting means and inspecting by said inspecting means the position and/or the electrical properties of the electronic parts mounted on the substrate positioned relative to said inspecting means;

subsequently transferring said first-mentioned substrate from the position associated with said dispenser means to the position associated with said mounting means, while, at the same time, transferring said second-mentioned substrate from the position associated with said mounting means to the position associated with said inspecting means by said first movable means; and repeating the above steps thereby sequentially carrying out dispensing of the bonding material to the same points on said substrates, mounting of the electronic parts at the same points on said substrates and inspection of the position and/or the electrical properties of the electronic parts mounted on said substrates.

4. A process for mounting electronic parts comprising the steps of:

preparing at least four substrates on each of which a plurality of electronic parts are to be mounted;

disposing said four substrates on first movable means in a relation in which said substrates are maintained in predetermined relative positions;

disposing dispenser means for dispensing a bonding material for bonding the electronic parts to each of said substrates, mounting means for mounting the electronic parts on each of said substrates, inspecting means for inspecting the position and/or the electrical properties of the electronic parts mounted on each of said substrates and fixing means for fixing the bonding material on each of said substrates, on second movable means in a relation in which said dispenser means, said mounting means, said inspecting means and said fixing means are maintained in the same relative positions as those of said four substrates on said first movable means;

moving said second movable means relative to said first movable means according to a predetermined program while actuating said dispenser means, said mounting means, said inspecting means and said fixing means, thereby dispensing the bonding material from said dispenser means to predetermined points on the substrate positioned relative to said dispenser means, while, at the same time, mounting the electronic parts by said mounting means at predetermined positions on the substrate positioned relative to said mounting means, inspecting the position and/or the electrical properties of the electronic parts mounted on the substrate positioned relative to said inspecting means and fixing by said fixing means the bonding material on the substrate positioned relative to said fixing means;

subsequently transferring said first-mentioned substrate from the position associated with said dispenser means to the position associated with said mounting means, while, at the same time, transferring said second-mentioned substrate from the position associated with said mounting means to the position associated with said inspecting means and transferring said third-mentioned substrate from the position associated with said inspecting means to the position associated with said fixing means by said first movable means; and repeating the above steps thereby sequentially carrying out dispensing of the bonding material to the same points on said substrates, mounting of the electronic parts at the same positions on said substrates, inspection of the position and/or the electrical properties of the electronic parts mounted on said substrates and fixing of the bonding material on said substrates.

5. A process as claimed in claim 2 or 4, wherein said fixing means is a thermal fixing unit.

* * * * *